(12) United States Patent
Yu

(10) Patent No.: US 7,795,103 B2
(45) Date of Patent: Sep. 14, 2010

(54) BIPOLAR TRANSISTORS WITH DEPLETED EMITTER

(75) Inventor: Ho-Yuan Yu, 19308 Vendura Ct., Saratoga, CA (US) 95070

(73) Assignee: Ho-Yuan Yu, Saratoga, CA (US)

( * ) Notice: Subject to any disclaimer, the term of this patent is extended or adjusted under 35 U.S.C. 154(b) by 691 days.

(21) Appl. No.: 11/804,229

(22) Filed: May 17, 2007

(65) Prior Publication Data

US 2007/0267656 A1  Nov. 22, 2007

Related U.S. Application Data

(60) Provisional application No. 60/802,027, filed on May 19, 2006.

(51) Int. Cl.
*H01L 21/331* (2006.01)
(52) U.S. Cl. ....................... 438/342; 438/309
(58) Field of Classification Search .................. 438/309, 438/342
See application file for complete search history.

(56) References Cited

U.S. PATENT DOCUMENTS

| | | | |
|---|---|---|---|
| 4,259,680 A | 3/1981 | Lepselter et al. |
| 4,483,726 A | 11/1984 | Isaac et al. |
| 4,581,319 A | 4/1986 | Wieder et al. |
| 4,729,965 A | 3/1988 | Tamaki et al. |
| 5,024,957 A | 6/1991 | Harame et al. |
| 5,098,854 A | 3/1992 | Kapoor et al. |
| 5,101,256 A | 3/1992 | Harame et al. |

*Primary Examiner*—Douglas M Menz
(74) *Attorney, Agent, or Firm*—Cheng Intellectual Property Group

(57) ABSTRACT

This invention disclosed a novel method of fully depleted emitter so that the built-in potential between emitter and the base becomes lower and the charge storage between the emitter and base becomes small. This concept also applies to the diodes or rectifiers. With depleted junction, this result in very fast switching of the diodes and transistors. Another novel structure utilizes the strip base structure to achieve lower on resistance of the bipolar transistor. The emitter region of the strip base can be a normal emitter or depleted emitter.

9 Claims, 8 Drawing Sheets

BIPOLAR TRANSISTORS WITH DEPLETED EMITTER

CROSS REFERENCE TO RELATED APPLICATIONS

This application claims priority from U.S. Provisional Patent Application No. 60/802,027 filed May 19, 2006 and entitled "Bipolar Transistor with Depleted Emitter". The Provisional application is herein incorporated by reference. This application contains subject matter that may be related to the subject matter in U.S. application with Ser. No. 11/801,023, filed on May 8, 2007, entitled "Fast Recovery Rectifier", by the same inventor.

BACKGROUND OF THE INVENTION

1. Field of the Invention

This invention relates to the general construction of Bipolar Transistors with innovative device concept of the depleted emitter region for the reduction of charge region between emitter to the base. This invention also disclosed various bipolar transistor device structures with depleted emitter for the improvement of the transistor speed.

2. Description of the Prior Art

U.S. Pat. No. 4,259,680 Lepselter and Sze disclosed a bipolar transistor structure for a N+PN+ transistor for a high speed lateral bipolar transistor, U.S. Pat. No. 4,483,726 Issac et al disclosed a double self-aligned fabrication process for making a bipolar transistor structure having a small polysilicon to extrinsic base contact area, U.S. Pat. No. 4,581,319 Wieder et al disclosed the method for the manufacturing of bipolar transistor structures with self adjusting emitter and base regions for the extreme high frequency circuits. U.S. Pat. No. 4,729,965 Tamaki et al disclosed the method of forming extrinsic base by diffusion from polysilicon/silicide source and emitter by lithography. U.S. Pat. No. 5,024,957 Harame et al disclosed a method of fabricating a bipolar transistor with ultra-thin epitaxial base. U.S. Pat. No. 5,098,854 Kapoor et al disclosed the process for forming self aligned silicide base contact for bipolar transistor. U.S. Pat. No. 5,101,256 Harame et al disclosed a bipolar transistor with ultra thin epitazial base and method of fabricating same. All above patent disclosures are using heavily doped n or p as the emitter.

SUMMARY OF THE INVENTION

The objective of present invention is to use a depleted emitter as compared to the traditional heavily doped emitter device structure. This invention disclosed the methods of making smaller emitter to base charge region and lower built-in potential between emitter to base thus faster transistor characterization can be achieved. The depleted p–n junction can also apply to the diodes or rectifiers for fast reverse recovery applications. This patent also disclosed various device structures and a unique broken base region that can achieve lower on resistance of the bipolar transistors. This invention also disclosed the fully depleted emitter for the IGBT device.

DETAILED DESCRIPTION OF THE PREFERRED EMBODIMENT

Embodiment One

FIG. 1A is a normal charge diagram of an abrupt n–p junction. The total area of $qNd \times xd1$ at n region is equal to $qNa \times xa1$ at p region. Where Nd is the doping concentration of the n region and xd1 is the charge distance of the n region. Where Na is the doping concentration of p region and xa2 is the charge distance of the p region. As the distance xd2 of n region becomes smaller by disclosed methods of the terminators, the total area of $qNd \times xd2$ is smaller than $qNd \times xd1$ with same doping level of Nd as shown in FIG. 1B. In order to balance the total charge, $qNa \times xa2$ is the equal to $qNd \times xd2$. Thus the built-in potential of FIG. 1B is smaller than the built-in potential of FIG. 1A. In order to get good ohmic contact, a very thin layer and heavily doped n type layer is placed at xd2 called the terminator. Otherwise a Schottky contact with reverse diode is connected to the n–p junction when the metallization is applied. The purpose of this terminator at xd2 is to terminate the n region and also to form the ohmic contact to the metallization. The same theory is also applied to p–n junction. The built-in potential of a normal n–p junction is ranging from less than 0.8 ev to over 0.9 ev for silicon material depending on the doping concentrations of the n–p junction. The depleted n–p junction has the built-in potential from below 0.9 ev to below 0.4 ev. The difference of the built-in potentials of the normal n–p junction to the depleted n–p junction is from lower than 0.01 ev to more than 0.40 ev.

Figure 1:
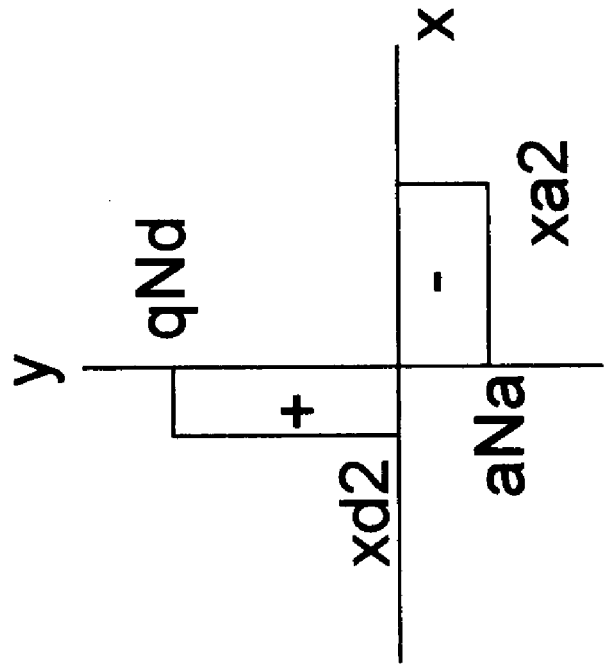
FIG. 1 shows a comparison the charge diagram of normal n–p junction in FIG. 1A versus depleted n–p junction shown in FIG. 1B.
Figure 1:
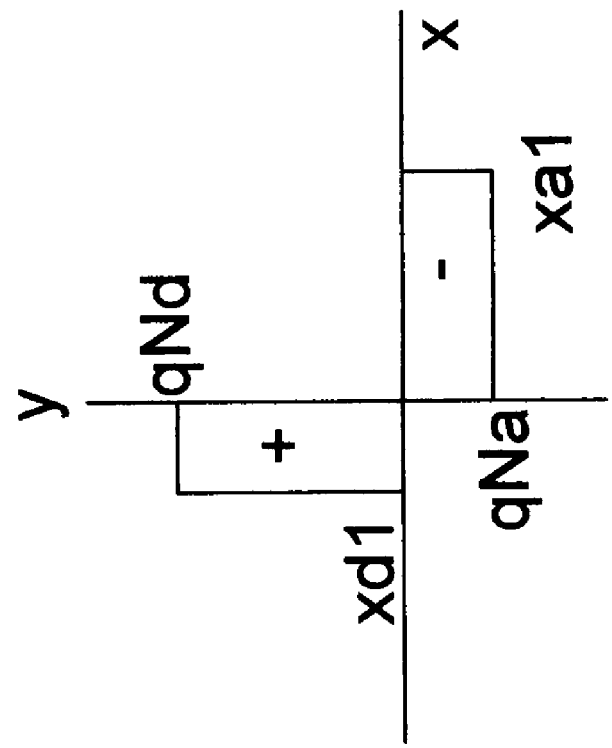
Figures 2, 2A, 2B, 2C:
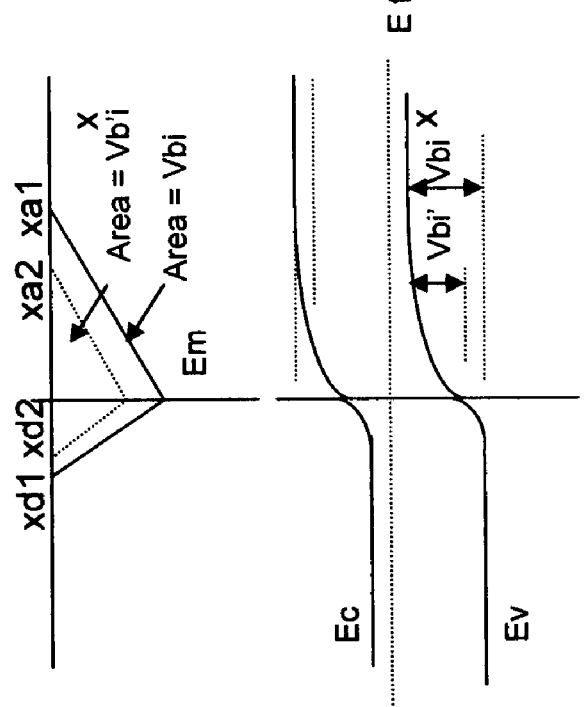
FIG. 2 shows a comparison of the charge diagram of normal n–p junction and depleted n–p junction, FIG. 2A, the potential differences, FIG. 2B, and the energy diagram of the normal and depleted n–p junction, FIG. 2C.

FIG. 2A illuminates the doping concentration diagram of the abrupt n–p junction with normal n–p junction in solid lines versus the depleted n–p junction in dotted lines. As the n side of the n–p junction is terminated earlier by a terminator, the p side charge region will also terminated earlier in order to seek the charge balance. FIG. 2A shows a clear view of FIGS. 1A and 1B. The built-in potential is in the area shown in FIG. 2B. The vertical axis is the electric field and the maximum electric field located at x=0. The normal n–p junction has the built-in potential shown in the solid line triangle area and the depleted n–p junction is shown in dotted line triangle area. FIG. 2C shows the energy diagram of the n–p junction in equilibrium condition, the Fermi energy is shown in a flat dotted line and the conduction band of n type region is connected to the conduction band of p type region via the charge region in both sides of the junction and valence band is connected from the n type region to the valence band of p type region also via the charge region. The key concept to terminate the lightly doped region is to use very thin and heavily doped layer called a terminator to provide the ohmic contact to the metallization layer. This terminator is made by a thin layer of heavily doped region to connect to the fully depleted n type region by using low temperature diffusion or implant or via a very thin layer of poly film with heavily doping by low temperature diffusion without going through the depleted n region. Otherwise a Schottky contact with different polarity to the metallization layer could happen and can not achieve the requirement for a good p–n junction.

Figure 3:
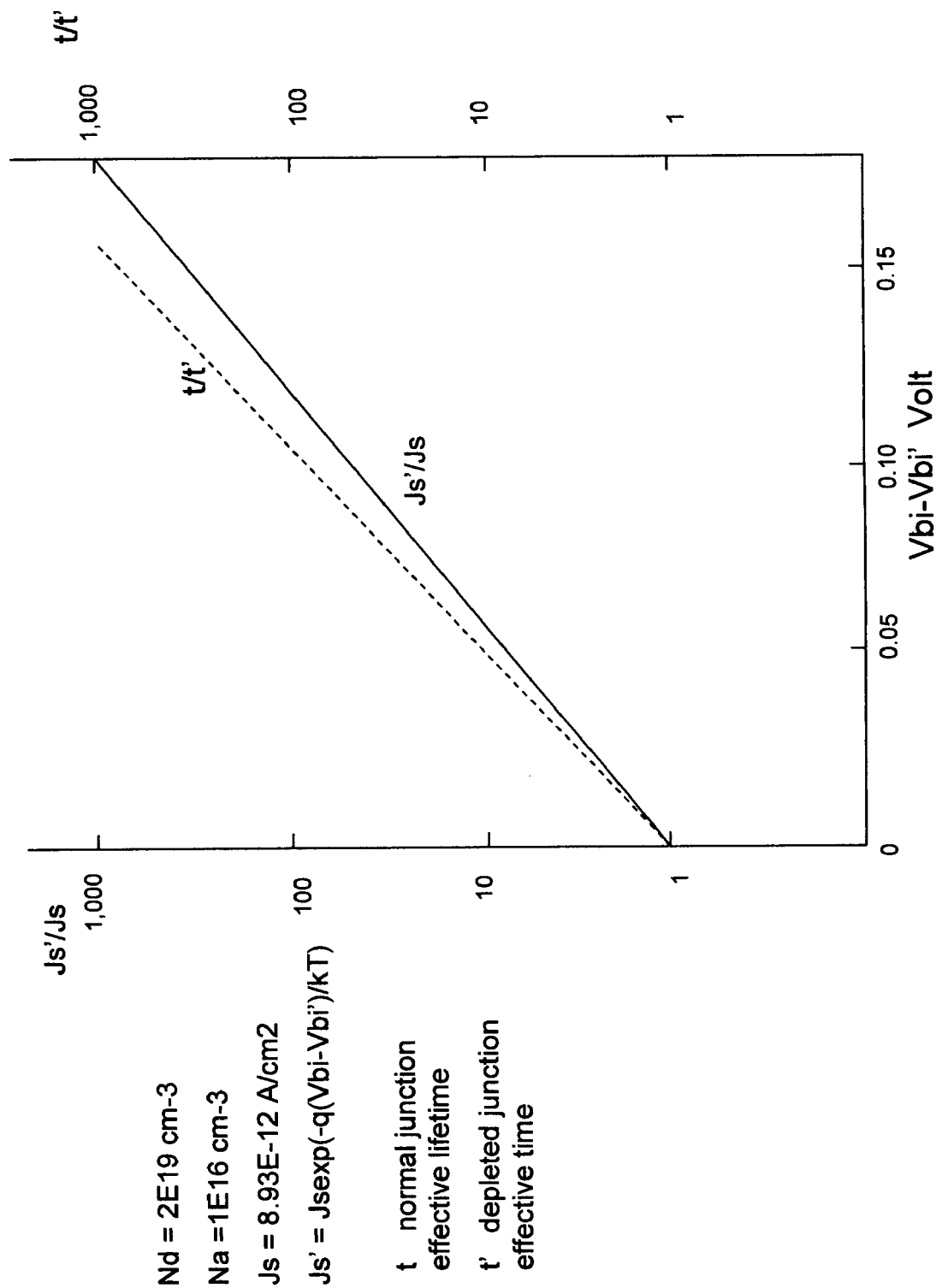
FIG. 3 shows diagram of Js vs Js' and t vs t' for normal n–p junction versus the depleted n–p junction.

FIG. 3 shows the diagram of Js'/Js and t/t' versus the difference of built-in potential in terms of ev for silicon material. The doping concentration of this Figure is Nd=2 E19 cm-3 and Na=1 E16 cm-3 for silicon material as used in this Figure as an example, the saturation current density is calculated as Js=8.93 E-12 A/cm2. When the n region (emitter) is terminated earlier in fully depleted mode, the depleted mode saturation current Js' can be approximately shown as Js'=Js exp (q/kT(Vbi−Vbi')) where Js is the saturation current density of the normal n–p junction of Nd=2 E19 cm-3 and Na=1 E16 cm-3. Vbi of 0.906 ev is calculated as the built-in potential of the normal n–p junction at room temperature and Vbi' is the built-in potential of the depleted n–p junction as shown in FIG. 2B. In FIG. 3 t is the effective lifetime of the normal n–p junction and t' is the effective lifetime of the depleted n–p junction. The x axis of FIG. 3 is the difference of the built-in potential of the normal n–p junction to the built-in potential of the depleted n–p junction. As x axis moves to right, the fully depleted n–p junction has smaller built-in potential, the space charge region is smaller, the effective life time becomes much smaller thus the bipolar transistor speed becomes faster. The saturation current density becomes larger when the built-in potential is smaller as shown in the equation and this diagram. Thus the depleted n–p junction can approach to Schottky rectifier's performance.

Embodiment Two

Figure 4:
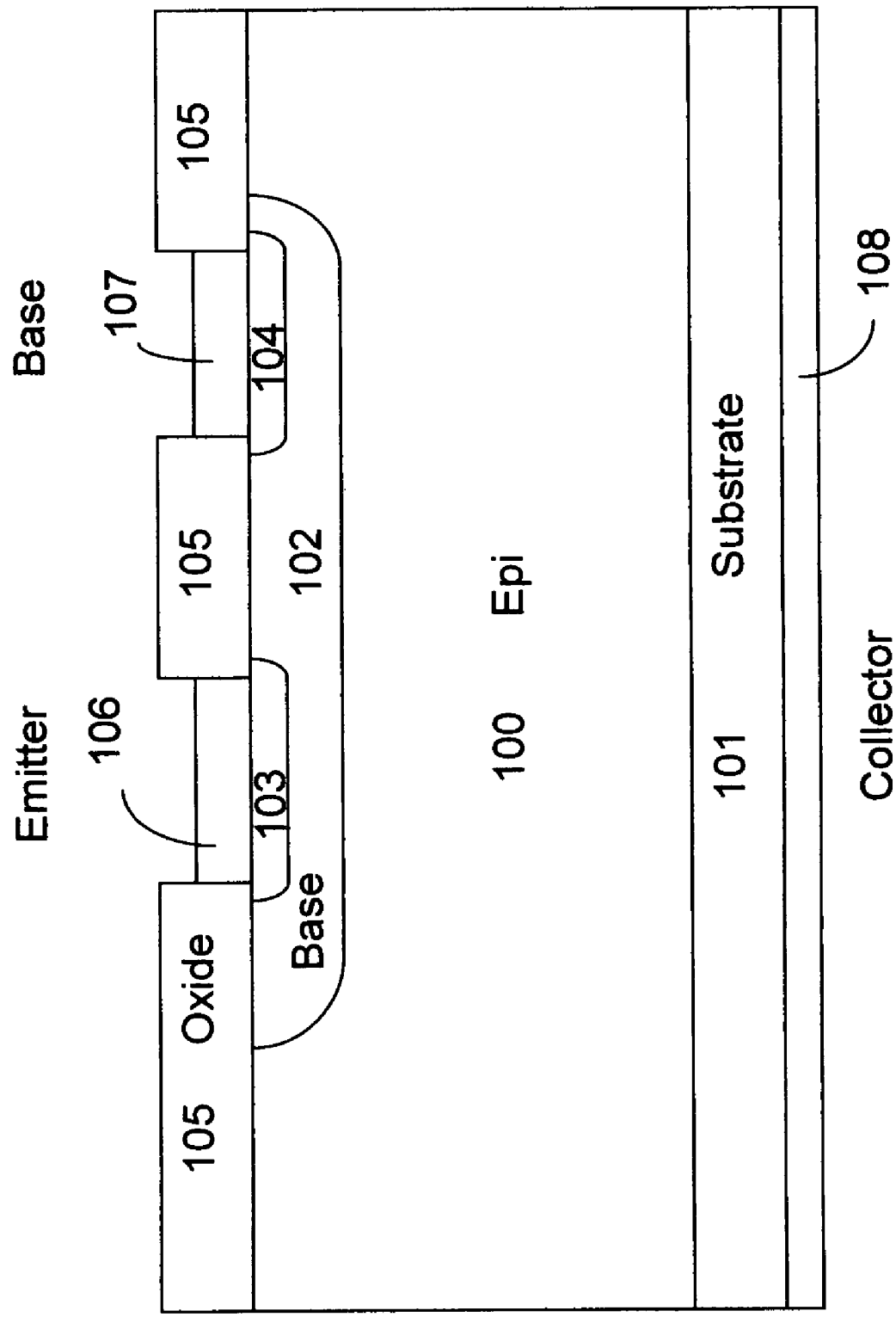
FIG. 4 shows a vertical bipolar transistor of prior art.

FIG. 4 shows a standard vertical bipolar transistor in the prior art. Layer 101 is a heavily doped substrate. Layer 100 is a lightly doped epitaxial layer with the same polarity as the substrate. Later 102 is the layer of opposite polarity of the epitaxial layer as the base of the bipolar transistor. Layer 103 is a heavily doped layer with the opposite polarity as the layer 102 and with the same polarity as the layer 100. Layer 104 is a heavily doped with the same polarity as the layer 102. This layer 104 serves as the ohmic contact to the base layer 102 and the metal layer 107 as the base terminal. Later 105 is the oxide layer to be formed either by thermal oxidation or CVD or both. Layer 106 is the metallization for the emitter contact. Layer 106 and layer 107 can be form either by Aluminum layer for wire bond or the NiAu layers on the top of Aluminum layer for the solder joint or other metallization layers. Layer 108 is a metallization layer that can be formed either by TiNiAg films, CrAu films or nickel plating. This layer 108 is used for the collector terminal to be soldered onto the package.

Figure 5:
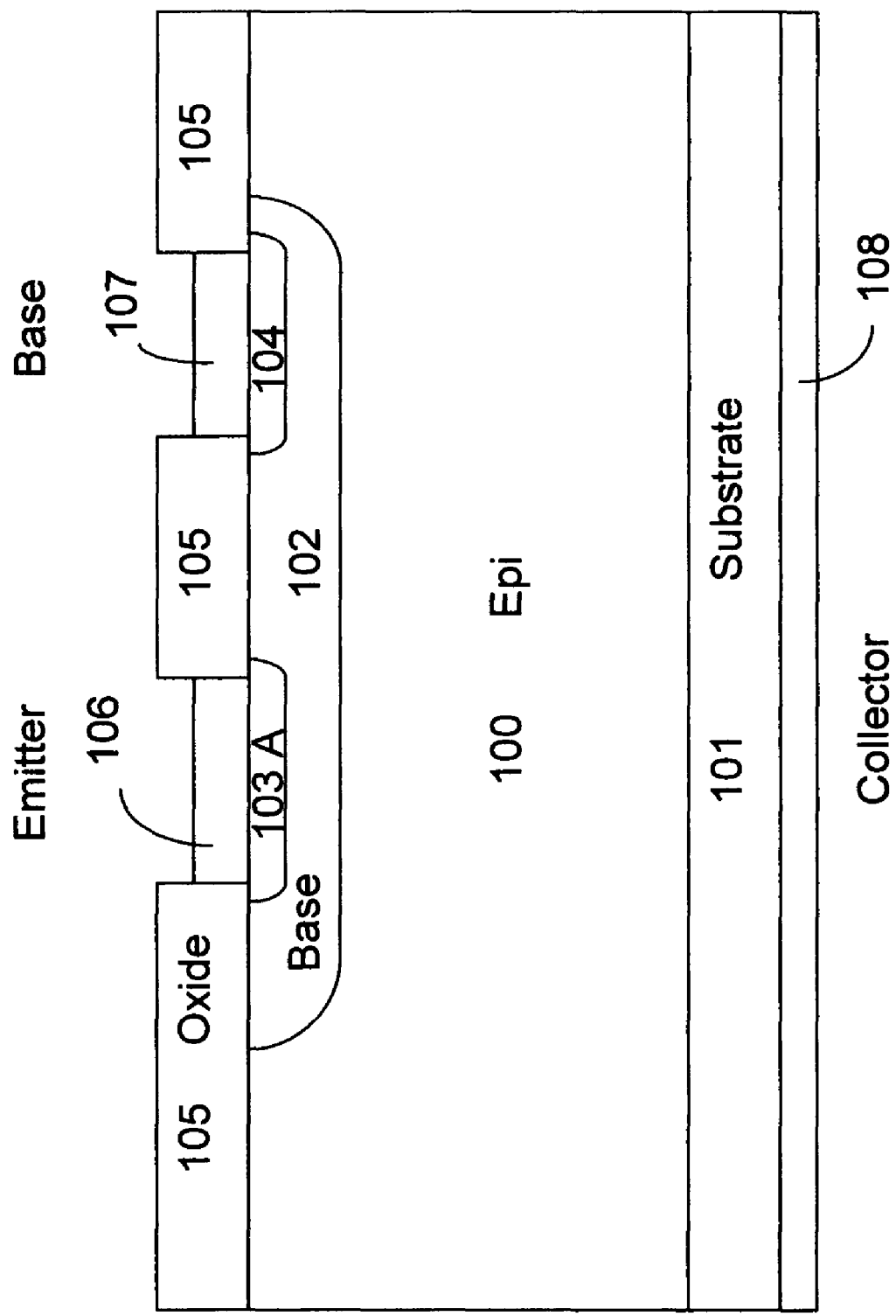
FIG. 5 shows a vertical bipolar transistor with depleted emitter.

FIG. 5 is the same as the FIG. 4 except the layer 103A is a depleted region with the polarity opposite to the layer 102 as described in FIGS. 1, 2 and 3. This layer 103A can be higher, slightly high or even lower doping concentration with the opposite polarity to the layer 102. Layer 103A is very thin so that the depletion layer is fully depleted and in this condition the built-in voltage between emitter and the base is less than the full built-in potential as described in FIG. 2A. A terminator of very low implant energy and moderate dose to provide heavy surface concentration is implanted on the top of layer 103A to the emitter region. The implant dose for the region 103A is from 1.0 E11 to 1.0 E14 with the energy from less than 100V to over 10 KV. The terminator of 103A requires the implant dose from 1.0 E12 to 1.0 E15 with the implant energy from less than 100V to over 1000V. The terminator can also use low temperature diffusion with the same polarity of 103A from 700 deg C. to over 1100 deg C. with time from over two hours to less than 30 seconds. The implant anneal temperature can be performed from 1150 deg C. to 600 deg C. with time from less than 10 sec to 30 min. The terminator can also use a thin layer of poly silicon film on the top of 103A and completed by diffusion of low temperature or implant by low and moderate dose and energy described above. The thermal process of the terminator must not drive the doping to go through the layer 103A to become normal n+p junction. Due to fully depleted layer of 103A, the charge storage is thus reduced compared with n+p junction. With the reduced emitter to base charge, the transistor is thus faster compared with standard emitter to base junction as illustrated in FIGS. 2 and 3. The same theory also applies top type emitter to n type base junction.

Embodiment Three

Figure 6:
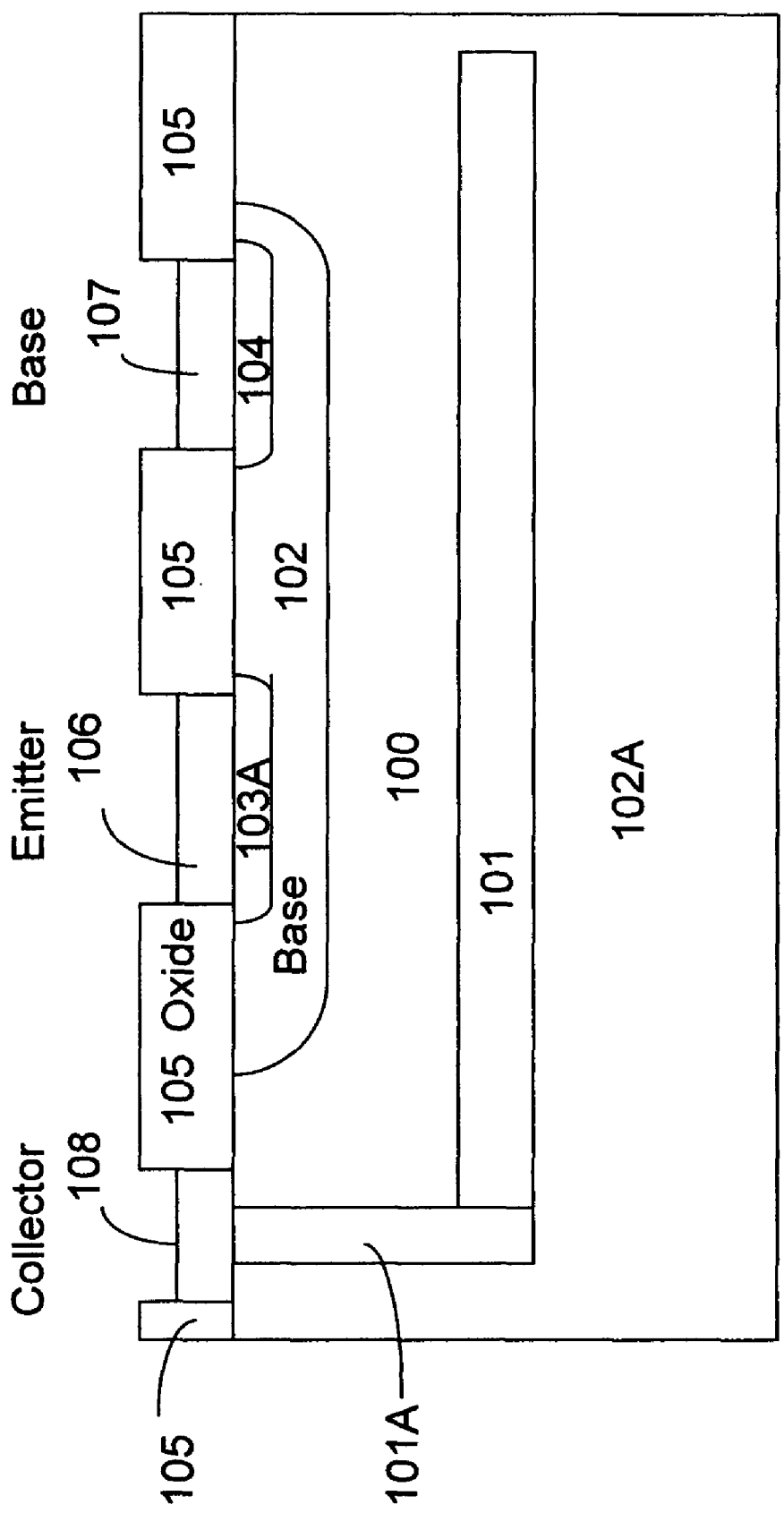
FIG. 6 shows a lateral bipolar transistor with depleted emitter.

FIG. 6 is a lateral bipolar transistor with depleted emitter region 103A. Layer 101 is a heavily doped with the different polarity with the substrate 102A and same polarity as the epi layer 100. The buried layer 101 is formed by diffusion before the epitaxial layer 100 deposition. The epitaxial layer 100 is the same polarity of the substrate 102A. The structure 101A is formed by deep diffusion of the same polarity as the epi layer 100. Layer 104 is a heavily doped layer with the same polarity as the layer 102 for the ohmic contact to the base region. The metallization of 106 and 107 is generally an Aluminum layer. The region 106 is the emitter, 107 is the base and 108 is the collector. This layer 103A can be higher, slightly high or even lower doping concentration with the opposite polarity to the layer 102. Layer 103A is very thin so that the depletion layer is fully depleted and in this condition the built-in voltage between emitter and the base is less than the full built-in potential as described in FIGS. 1A and 1B. A terminator of very low implant energy and moderate dose to provide heavy surface concentration is implanted on the top of layer 103A to the emitter region. The implant dose for the region 103A is from 1.0 E11 to 1.0 E14 with the energy from less than 100V to over 10 KV. The terminator of 103A requires the implant dose from 1.0 E12 to 1.0 E15 with the implant energy from less than 100V to over 1000V. The terminator can also use low temperature diffusion from 700 deg C. to over 1100 deg C. with time from over two hours to less than 30 seconds. The implant anneal temperature can be performed from 1150 deg C. to 600 deg C. from less than 10 sec to 30 min. The terminator can also use a thin layer of poly silicon film on the top of 103A and completed by diffusion of low temperature or implant by low and moderate dose and energy. The thermal process of the terminator must not drive the doping to go through the layer 103A to become normal n+p junction. Due to fully depleted layer of 103A, the charge storage is thus reduced compared with n+p junction. With the reduced emitter to base charge and capacitance, the transistor is thus faster compared with standard emitter to base junction as illustrated in FIGS. 2 and 3. The same theory also applies to p type emitter to n type base junction.

Figure 7:
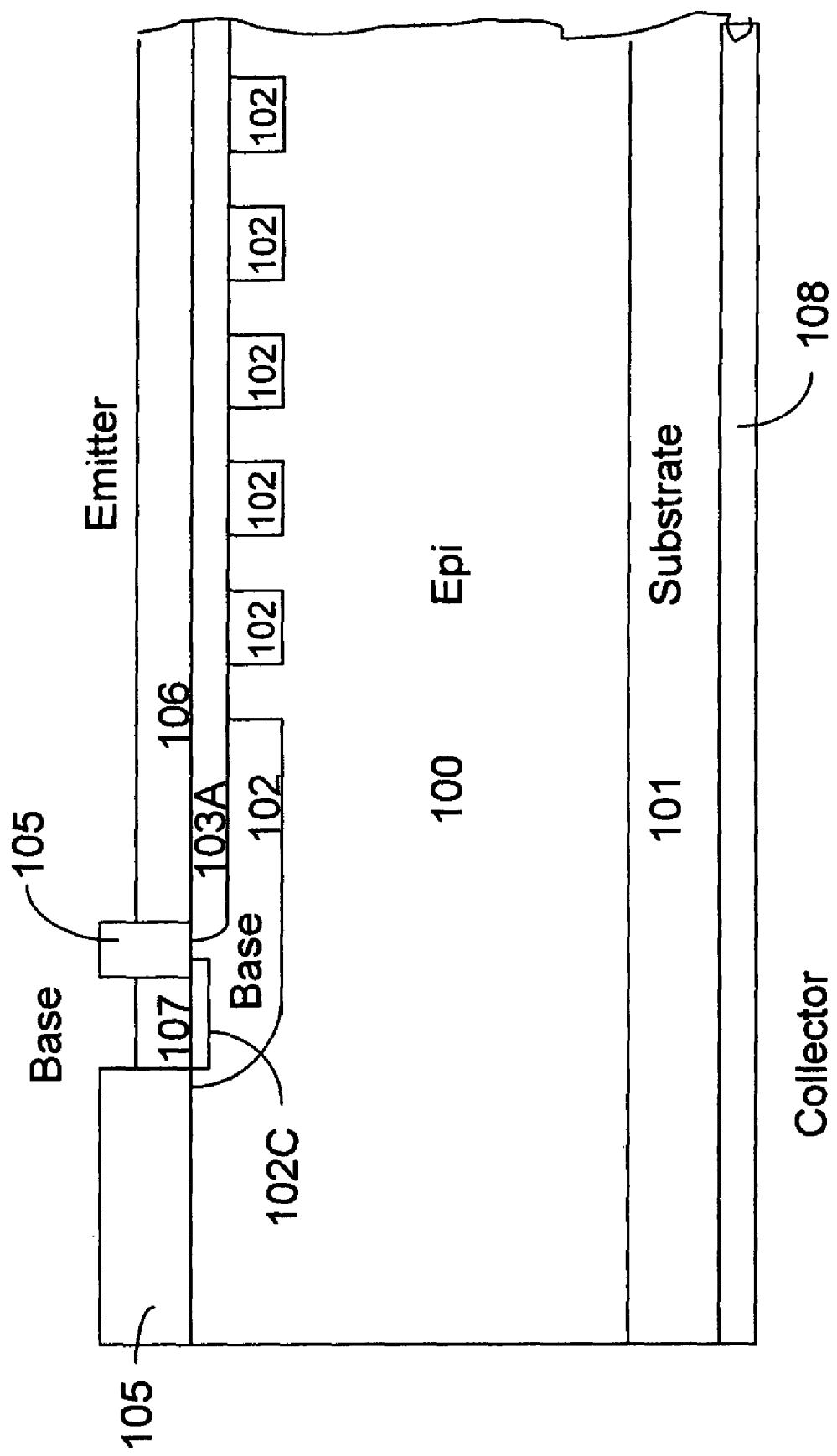
FIG. 7 shows a vertical bipolar transistor with depleted emitter and base strips.

FIG. 7 is a novel structure of the bipolar transistor on the side view. The emitter region 103A is a fully depleted or incomplete region as shown in FIGS. 2 and 3. The base layer 102 is a strip structure (i.e. a broken base region) comprising a plurality of regions with the gap between any two neighboring regions small enough that the depletion layer of 102 in the epi region 100 is extended to cover this gap. When the base voltage is zero or negative voltage against the emitter and collector, this structure is looking like a standard bipolar transistor. When the base voltage is forward biased to the emitter and the collector, the transistor is looking like the JFET. This thus reduces the conduction resistance compared with the bipolar transistor. Since the reduction of the emitter to base capacitance and charge, this structure is faster than the comparable bipolar transistors.

The layer 102C is heavily doped region with the same polarity as the layer 102 for the ohmic contact to the base metal. Layer 107 is the base contact and 106 is used for the emitter contact. The metallization of 106 and 107 can be done by Aluminum layer for wire bond or with NiAu plating on the top of Aluminum for soldering bond. Layer 108 is the bottom metallization layer for the collector terminal. This metallization is generally to be done by TiNiAg, CrAu or by simple nickel plating. Again, the layer 103A can be higher, slightly high or even lower doping concentration with the opposite polarity to the layer 102. Layer 103A a depleted layer of emitter region and in this condition the built-in voltage between emitter and the base is less than the full built-in potential as described in FIG. 2A. A terminator of very low implant energy and moderate dose to provide heavy surface concentration is implanted on the top of layer 103A to the emitter region. The implant dose for the region 103A is from 1.0 E11 to 1.0 E14 with the energy from less than 100V to over 10 KV. The terminator of 103A requires the implant dose from 1.0 E12 to 1.0 E15 with the implant energy from less than 100V to over 1000V. The terminator can also use low temperature diffusion from 700 deg C. to over 1100 deg C. with time from over two hours to less than 30 seconds. The implant anneal temperature can be performed from 1150 deg C. to 600 deg C. from less than 10 sec to 30 min. The terminator can also use a thin layer of poly silicon film on the top of 103A and completed by diffusion of low temperature or implant by low and moderate dose and energy. The thermal process of the terminator must not drive the doping to go through the layer 103A to become normal n+p junction. Due to fully depleted layer of 103A, the charge storage is thus reduced compared with n+p junction. With the reduced emitter to base charge, the transistor is thus faster compared with standard emitter to base junction as illustrated in FIGS. 2 and 3. The same theory also applies to p type emitter to n type base junction.

Embodiment Four

Figure 8:
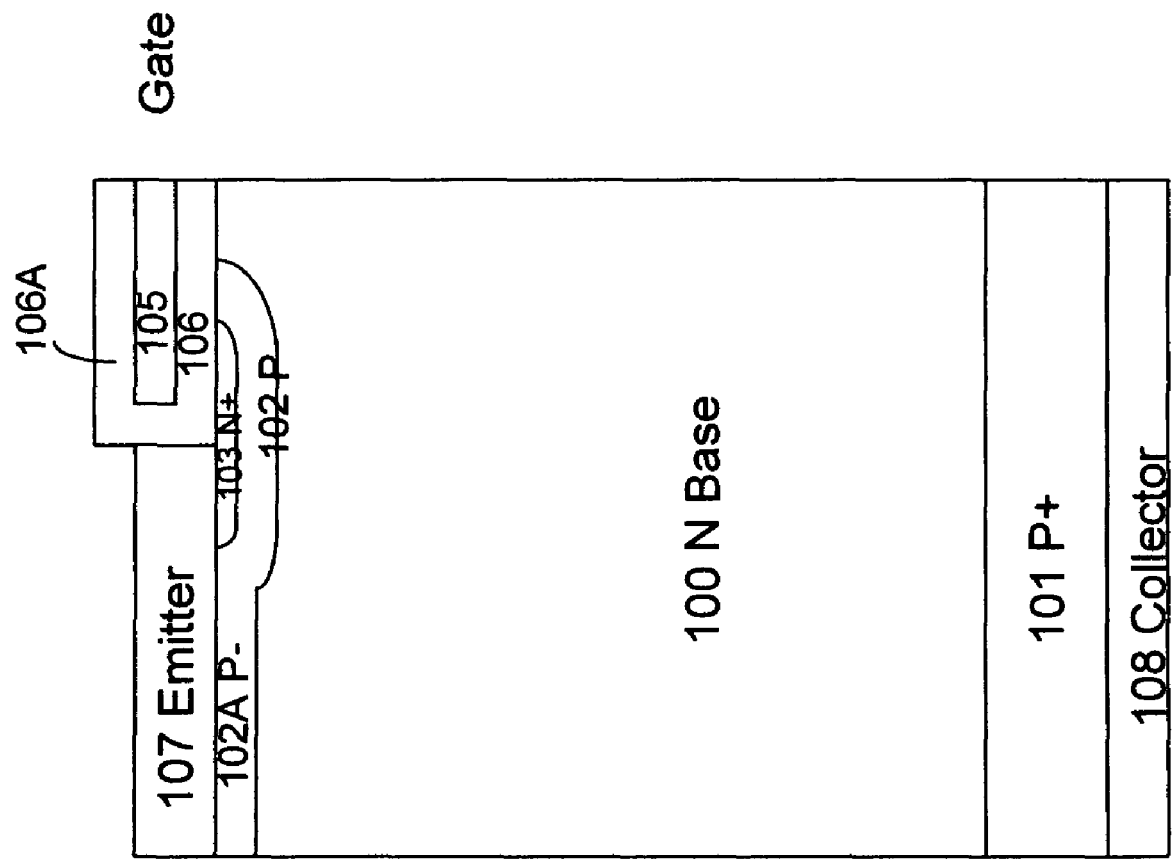
FIG. 8 shows an IGBT cell diagram of depleted emitter of the bipolar transistor.

FIG. 8 shows an IGBT cell structure with depleted emitter for the fast response. For example, the substrate 101 is a heavily doped p type material as the collector. Epitaxial layer 100 is served as the base which is in opposite polarity of the substrate 101. The gate region 105 can be a doped poly layer or a silicide layer. The gate oxide 106 can be formed by thermal oxidation and layer 106A is a CVD oxide to serve an insulation layer around the gate 105. Layer 102A is a depleted region with opposite polarity of the base region. The built-in potential of 102A to base 100 has lower built-in potential compared with the normal p-n junction. Thus the fast bipolar transistor speed can be reached. The layer 102 connected to layer 102A is a normal doped p region to serve as the base for the conduction channel of the MOSFET between the 103, n+, layer to the n type base or drift region. A thin and heavily doped terminator is place between 102A and the emitter metallization 107. The terminator is described in FIGS. 5, 6, and 7. The metallization layer 107 is usually a thick Aluminum layer for the wire bond or a layer of NiAu on top of Aluminum layer for the soldering. The metallization layer 108 can be TiNiAg, CrAu, or Ni plating for the soldering of the device to the package.

What is claimed is:

1. A method for creating a depleted emitter of a bipolar transistor, comprising:
    forming a base layer of said bipolar transistor with a first dopant of one polarity, wherein said base layer is eventually connected to a base terminal;
    forming an emitter layer of said bipolar transistor with a second dopant above said base layer to create an emitter-base junction, wherein said second dopant having an opposite polarity to said first dopant;
    forming a thin termination layer of heavy doping of said second dopant on top of said emitter layer by a thermal process, wherein said thermal process allows said dopant of the termination layer to stay within said emitter layer, such that said emitter-base junction does not become a normal $n^+$-p or $p^+$-n junction and the built-in potential of said emitter-base junction ranges from about 0.9 eV to about 0.4 eV; and
    forming a metallization layer above said termination layer, wherein said termination layer can provide an ohmic contact to said metallization layer.

2. The method of claim 1, wherein said thermal process comprises:
    performing an implant in said emitter layer with implant dose ranging from about 1.0 E11 to about 1.0 E14 and implant energy ranging from about 100 V to about 10 KV; and
    Subsequently, performing an implant in said termination layer with implant dose from about 1.0 E12 to about 1.0 E15 and implant energy from about 100 V to about 1000 V.

3. The method of claim 1, wherein said thermal process comprises:
    applying a low temperature diffusion with the same polarity as said emitter layer, wherein temperature ranges from about 700° C. to about 1100° C. with time ranging from about two hours to about 30 seconds.

4. The method of claim 1, wherein said thermal process comprises:
    performing an implant anneal of said termination layer with temperature from about 1150° C. to about 600° C. and time from about 10 seconds to 30 minutes, and depositing a thin layer of poly silicon; and
    subsequently applying a low temperature diffusion with temperature ranging from about 700° C. to about 1100° C. and time ranging from about two hours to about 30 seconds.

5. The method of claim 1, wherein said emitter-base junction can be applied to said bipolar transistor in either vertical or lateral device structure.

6. The method of claim 1, further comprising a lightly doped epitaxial layer of said second dopant below said base layer.

7. The method of claim 6, wherein said base layer further comprising a strip structure having a plurality of regions separated by gaps, wherein each gap between any two neighboring regions is substantially small to allow the depletion region between said base layer and said epitaxial layer to cover said corresponding gap.

8. The method of claim 7, wherein said gaps further allow said regions of said base layer to close current flow between emitter and collector of said bipolar transistor when base is in reverse bias against said emitter and said collector.

9. The method of claim 7, wherein said gaps further allow conduction paths to form between said regions of said base layer and behave like a Junction Field-Effect Transistor (JFET) when base is in forward bias against emitter and collector.

* * * * *